INVENTOR
J. M. EUBANKS
BY L. T. Rahn Jr.
ATTORNEY

United States Patent Office 3,435,252
Patented Mar. 25, 1969

3,435,252
D.C. RESTORER

John M. Eubanks, Greensboro, N.C., assignor to Bell Telephone Laboratories, Incorporated, New York, N.Y., a corporation of New York Filed Aug. 26, 1964, Ser. No. 392,332
Int. Cl. H03k 5/08, 5/18, 5/20
U.S. Cl. 307—237 7 Claims

ABSTRACT OF THE DISCLOSURE

A D.C. level is restored to voltage pulses in an input signal by connecting the signal to the input of a high gain phase-reversal amplifier, the output of which is connected through a normally open transistor switch to an output circuit. A first feedback loop connected between the amplifier output and input maintains the amplifier output at voltage levels which are lower than that required to operate the transistor switch. A switching means within the feedback loop opens the loop in response to a rate of rise of voltage at the amplifier output which exceeds a predetermined threshold value, thereby permitting the amplifier output to achieve a voltage at which the transistor switch operates and connects the amplifier output to the output circuit. A second feedback loop is provided between the output circuit and amplifier input in order to maintain signal levels at the output circuit within bounds. When the input signal returns to a voltage slightly lower than that at which the transistor switch was operated, the transistor switch is again open-circuited and the first feedback loop is reestablished thereby confining the output voltage of the amplifier to a range of voltage levels within which the transistor switch remains inoperative.

This invention relates to nonlinear circuits and, more particularly, to a D.C. restorer.

The function of a D.C. restorer, sometimes called a clamping circuit, is to clamp a pulse signal to a reference voltage during part of each pulse cycle. As a result, a D.C. restorer is capable of converting a pulse signal having transient pulse tails and a "wandering," i.e., a varying, base level, which are characteristic of a pulse signal deprived of its direct-current and low-frequency components, into a signal that has a constant base level and reproduces exactly the wave form of each pulse. A major use of this type of circuit is, as its name implies, to restore low frequency and direct-currents ignal components to pulse signals that have traversed a transmission channel with a high-pass frequency characteristic, i.e., one that does not pass direct-current or low-frequency signal components. The full importance of direct-current restoration in pulse transmission systems can be realized by considering that any transmission channel in which two or more of its parts are coupled by a transformer or a capacitor has such a high-pass frequency characteristic and that pulse regenerators and detectors do not usually respond satisfactorily to a signal having a wandering base level and large transient tails.

In operation the most elementary kind of D.C. restorer maintains a clamped condition until the applied voltage exceeds a threshold value at which time the clamp releases and the pulse wave form is reproduced until the applied voltage returns to the threshold value and the clamp is restored. This type of circuit conventionally takes the form of a capacitor and a diode connected in series. The restored pulse signal appears across the diode and the threshold voltage that controls the release of the clamp appears across the capacitor. In order to permit the voltage across the capacitor to adjust as the base level of the signal wanders, a resistor is connected in parallel with the diode to speed up the discharge time of the capacitor. This resistor, however, accounts for a reduction in the precision of clamping. To renew the charge of the capacitor lost by virtue of the resistor, the diode conducts heavily at the start of some clamp periods causing the restored pulse signal to deviate from the reference voltage to which it ought to be clamped. Consequently, this kind of D.C. restorer is not very satisfactory in applications requiring precise clamping action of a pulse signal whose base line fluctuates quickly.

Other more complex kinds of D.C. restorers, many of them involving feedback, have been devised to overcome the shortcomings of the simple circuit described in the preceding paragraph. Most, if not all, of them must be designed with regard to the amplitude, shape, width, and/or repetition rate of the pulses upon which they are to operate. These circuits fail to perform adequately upon pulse signals having properties different from those for which the circuit was designed.

It is the object of this invention to improve the performance generally of a D.C. restorer, including its ability to operate upon pulse signals whose base line fluctuates quickly, its clamping precision, and its adaptability to pulse signals having a wide variety of properties.

The invention proceeds upon a new principle in the D.C. restorer art according to which a pulse signal is released from a clamped condition responsive to the rate of rise, i.e., the rate of change of the leading edge, of the pulses being operated upon, rather than the value of the signal voltage. This principle is bottomed upon the assumption that the rate of rise of each pulse will be greater than the rate of rise of any of the transient tails that may accompany the pulse. Thus, each pulse can be distinguished from its tails, the former being reproduced and the latter being eliminated by clamping action.

More specifically, a D.C. restorer implementing this principle takes the form of an operational amplifier having a main signal path including a high-gain amplifier stage and having two alternatively operative feedback loops. A normally closed switch is located in one feedback loop, which is connected from the output of the amplifier stage to its input, and a normally open switch is located in the main signal path between the output of the amplifier stage and the output of the D.C. restorer across which the restored signal is developed. The second feedback loop is connected from the output of the D.C. restorer to the input of the amplifier stage. Normally the D.C. restorer is in a clamped condition, the first feedback loop is closed, and the second feedback loop is open. In this condition the normally open switch isolates the applied pulse signal from the output of the D.C. restorer, which is clamped to a reference voltage. When the rate of rise of the pulse signal applied to the D.C. restorer exceeds a threshold value, which is greater than the rate of rise of any of the transient tails, the normally closed switch opens making the first feedback loop inoperative. Simultaneously, the normally open switch closes making the second feedback loop operative and transmitting the applied pulse signal to the output of the D.C. restorer. The output of the D.C. restorer continues to represent the wave form of the applied signal until it again returns to the voltage at which the threshold value of rate of rise was exceeded. At this point, the second feedback loop opens and the first feedback loop closes to place the D.C. restorer in a clamped condition again. In this manner, pulse signals having a wide range of properties and having a rapidly fluctuating base level are precisely clamped to a reference voltage.

These and other features of the invention are further explained in the following detailed description taken in conjunction with the drawings in which.

Figure 1:
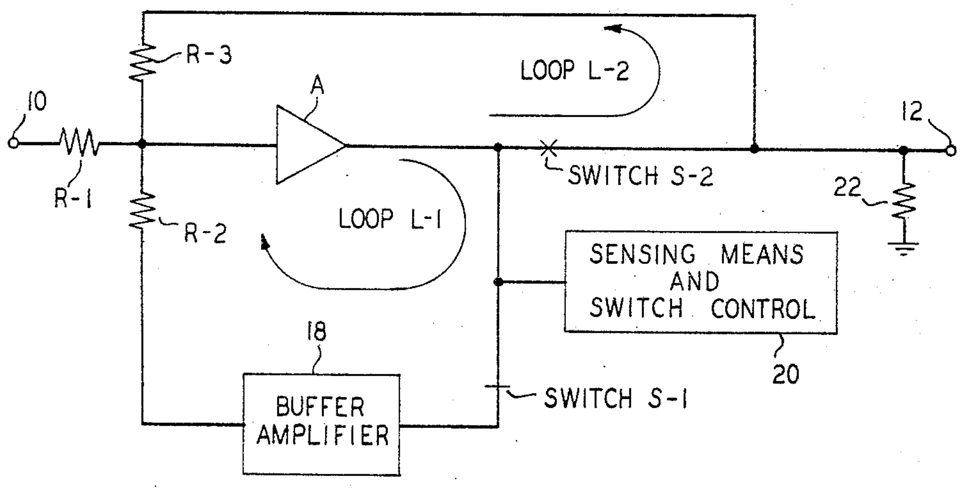
FIG. 1 is a functional schematic diagram showing a D.C. restorer implementing the principle of the invention.

In FIG. 1 an operational amplifier is shown having a main signal path connecting an input terminal 10 and an output terminal 12. The main signal path includes a resistor R–1, a high-gain amplifier A, and a normally open switch S–2. A feedback loop L–1 including a normally closed switch S–1, a buffer amplifier 18, and a resistor R–2 connect the output of amplifier A with its input. A feedback loop L–2 connects output terminal 12 with the input of amplifier A by means of a resistor R–3. A block 20, representing sensing means and switch control circuitry, is shown connected to monitor the output of amplifier A. Normally when an input signal is applied to input terminal 10 of the operational amplifier, loop L–2 is open by virtue of the state of switch S–2 and loop L–1 is closed. Thus, the output appearing across a load resistor 22, connected between terminal 12 and ground, is clamped to ground. By inserting a source of potential between resistor 22 and ground, output terminal 12 could be clamped to any other desired reference voltage. When the rate of rise of the input signal applied to terminal 10 exceeds a threshold value, signifying the start of the leading edge of a pulse, this fact is detected by the circuitry represented by block 20, which proceeds to close switch S–2 and open switch S–1. Thereafter a direct path exists between input terminal 10 and output terminal 12, loop L–2 is operative, loop L–1 is inoperative, and the input wave form is reproduced at output terminal 12. Loop L–2 remains operative until the input wave form returns to the voltage at which the rate of rise of the input signal exceeded the threshold value. At this point, signifying the end of the trailing edge of the pulse, loop L–2 again becomes inoperative and loop L–1 again becomes operative, to restore the clamped condition at output terminal 12.

Figure 2:
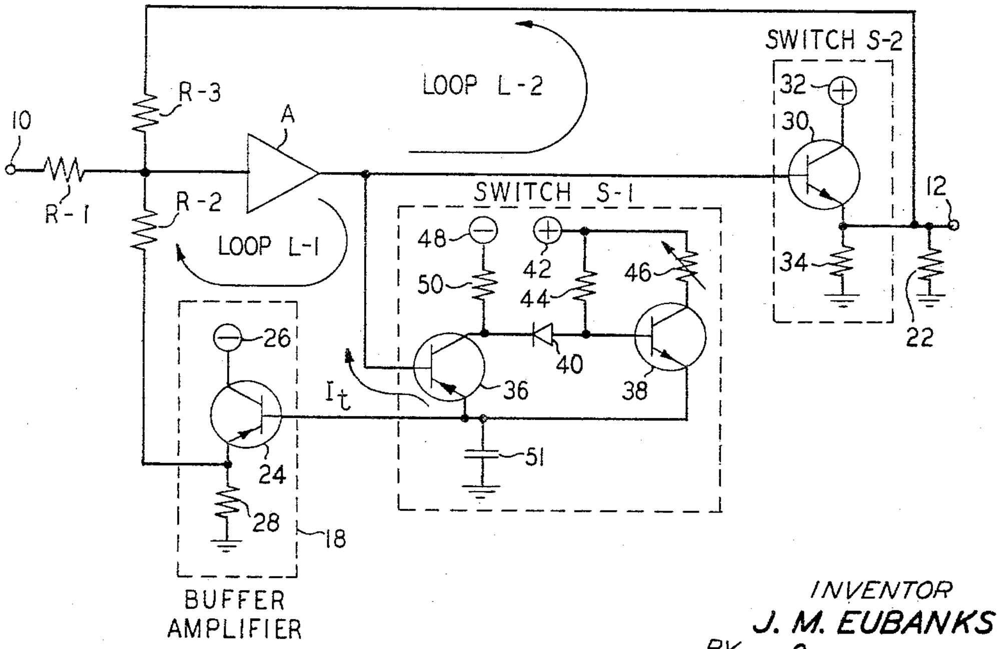
FIG. 2 is a circuit schematic diagram disclosing in more detail the D.C. restorer of FIG. 1.

FIG. 2 discloses in more detail the circuit of FIG. 1. The sensing means and switch control function of block 20 in FIG. 1 is not performed by any individual part of the arrangement of FIG. 2, but is performed by means of cooperation between the various parts of the circuit. Buffer amplifier 18 comprises a p-n-p transistor 24 having as a bias circuit a source 26 of negative potential and a resistor 28. Transistor 24 is connected as an emitter follower and operates class A. Switch S–2 comprises an n-p-n transistor 30 also connected as an emitter follower and having as a bias circuit a source 32 of positive potential and a resistor 34. Switch S–1 comprises a p-n-p transistor 36 and an n-p-n transistor 38. The collector of transistor 36 is connected to the base of transistor 38 by means of a diode 40 and the emitters of transistors 36 and 38 are connected together directly. Diode 40 is normally back-biased. As a bias circuit for transistor 38, its base is connected to a source 42 of positive potential by a resistor 44 and its collector is connected to source 42 by a variable resistor 46. Resistors 44 and 46 and the potential of source 42 are selected such that transistor 38 is normally saturated. As a bias circuit for transistor 36, its collector is connected to a source 48 of negative potential by a resistor 50. Resistor 50 and source 48 are also selected such that transistor 36 is normally saturated. Because transistor 38 is saturated, its emitter current is proportional to its collector resistance. The emitter current leaving transistor 38 can be considered to be equal to the emitter current entering transistor 36. Resistor 50 is very large so that the emitter current of transistor 36 can be considered to be equal to its base current, labeled $I_t$ in FIG. 2. Thus, variable resistor 46 provides an adjustment of the normal base current, $L_t$, of transistor 36. To change the state of switch S–2, which is normally open, to a closed condition the net emitter-to-base current of transistor 36, which is the algebraic sum of the normal, or what may be called the threshold current, $I_t$, caused by the bias circuits of transistors 36 and 38 and a current component, caused by means external to switch S–2 to be explained below, is momentarily reduced to zero. As a result, transistor 36 changes momentarily from saturation to cut-off. This establishes the potential of source 48 at the collector of transistor 36, causing diode 40 to conduct and imposing a reverse bias upon the emitter-to-base circuit of transistor 38. As a result, transistor 38 cuts off and its emitter current becomes zero. Since the bias current of transistor 36, $I_t$, is supplied from the emitter of transistor 38, it also becomes zero and cut-off of transistor 36 is maintained. To open switch S–2 again a momentary voltage is impressed across the emitter-to-base circuit of transistor 36, imposing a forward bias thereon that causes transistor 36 to saturate momentarily. Then transistor 38 saturates again. The saturation current of transistor 38 is in turn applied to the emitter of transistor 36, to maintain saturation of transistor 36.

Figure 3A:
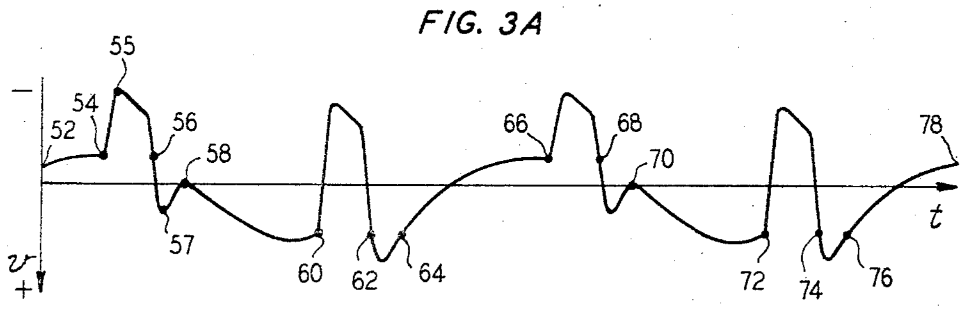
FIGS. 3A through 3D are wave form diagrams helpful in explaining the mode of operation of the D.C. restorer of FIG. 2.
Figure 3B:
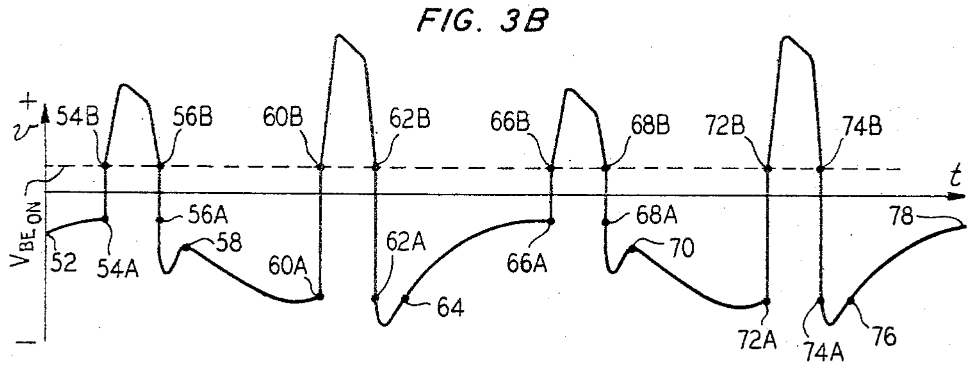

Reference is now made to the wave form diagrams in FIGS. 3A through 3D, which will be employed in an explanation of the mode of operation of the D.C. restorer of FIG. 2. Like numerals used on the diagrams designate the same points of time on the various wave forms illustrated. FIG. 3A illustrates a typical pulse signal upon which the circuit might operate. This pulse signal has a wandering base line shown between points 52 and 54, 58 and 60, 64 and 66, 70 and 72, and 76 and 78; it has pulses of different heights shown between points 54 and 56, 60 and 62, 66 and 68, and 72 and 74; and it has transient tails shown between points 56 and 58, 62 and 64, 68 and 70, and 74 and 76. It is assumed that the pulse signal shown in FIG. 3A is applied to input terminal 10. While the input signal is traversing its base line between points 52 and 54, loop L–1 is operative. The output of amplifier A, introducing a 180-degree phase shift, is represented in FIG. 3B. It should be noted that the positive direction of the ordinate axis in FIG. 3A is opposite to that in FIGS. 3B through 3D. This is done in order to illustrate the pulse wave forms in the same direction in all the diagrams. The quiescent operating conditions of the operational amplifier formed with loop L–1 closed are selected so that for the range of voltage to be expected at input terminal 10, the output of amplifier A does not exceed the cut-off voltage, $V_{BE_{ON}}$, of transistor 30, shown in FIG. 3B by a horizontal dashed line. Therefore, switch S–2 is open, loop L–2 is inoperative, and the output of the D.C. restorer appearing at terminal 12 is clamped to ground. This condition is represented between points 52 and 54 in FIG. 3C, which is a diagram of the wave form at output terminal 12.

Figure 3C:
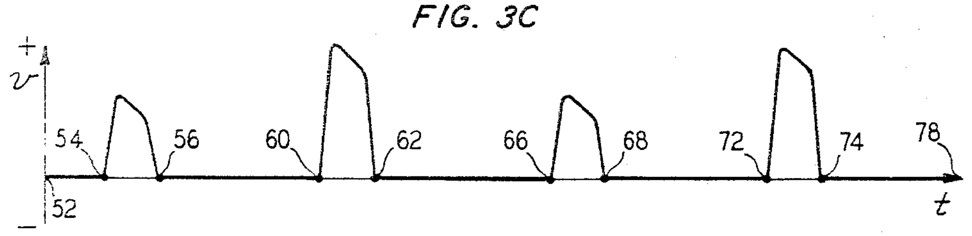

A capacitor 51 is connected between ground and the junction of the emitters of transistors 36 and 38. Switch S–1 being closed, capacitor 51 is connected to the output of amplifier A, and its charge adjusts as the voltage at the output of amplifier A varies. It is well known that the current passing through a capacitor is directly proportional to the rate of change of the voltage across it. The voltage and the rate of change of voltage across capacitor 51 are substantially identical to the voltage and the rate of change of voltage at the output of amplifier A. At the start of the leading edge of a pulse, represented by point 54 in FIG. 3A, the charging current of capacitor 51 flows through transistor 36 in the opposite sense to the threshold current, $I_t$. As the rate of rise of the pulse increases the charging current increases until it equals the threshold current, $I_t$, indicating that the threshold rate of rise has been reached. Switch S–1 then opens and loop L–1 becomes inoperative. The voltage at the output of amplifier A at the instant switch S–1 opens is stored across capacitor 51 because the only discharge path is through the high input impedance of buffer amplifier 18. This is illustrated between points 54 and 56 in FIG. 3D, which is a diagram of the wave form across capacitor 51. After loop L–1 becomes inoperative the gain between input terminal 10 and the output of amplifier A increases to the open loop gain of amplifier A, which is very large. Further changes in the voltage at input terminal 10 above the base line of the pulse signal at point 54 in FIG. 3A appear greatly amplified at the output of amplifier A, represented between points 54A and 54B in FIG. 3B. Thus, the output of amplifier A rises almost instantaneously until it reaches the cut-off voltage, $V_{BE_{ON}}$ of transistor 30. Then, switch S–2 closes, loop L–2 becomes operative to reduce the gain again, and the pulse wave form at input terminal 10 is reproduced at output terminal 12, as indicated in FIG. 3C, starting from a constant base line at ground. Tending to maintain loop L–2 operative, the circuit adjusts to quiescent operating conditions such that the voltage at the output of amplifier A is equal to the cut-off voltage, $V_{BE_{ON}}$ of transistor 30 for the value of the voltage at input terminal 10 at the instant in which switch S–1 opened, that is the value of voltage at point 54 in FIG. 3A. As the base line of the pulse signal changes to points 60, 66, and 72 and the value of input voltage at which switch S–1 opens changes, the quiescent conditions of loop L–2 adjust in corresponding fashion to produce a voltage $V_{BE_{ON}}$ at the output of amplifier A for the value of input voltage at which switch S–1 opened.

When the input signal returns at the end of the pulse to the value of voltage at which switch S–1 opened, i.e., point 56 in FIG. 3A, the voltage at the output of amplifier A drops below the cut-off point of transistor 30, switch S–2 opens, and loop L–2 becomes inoperative. Again, the gain between input terminal 10 and the output of amplifier A increases to the open loop gain of amplifier A. Further changes in the input voltage below point 56 in FIG. 3A appear greatly amplified at the output of amplifier A, represented between points 56B and 56A in FIG. 3B. Thus, the output of amplifier A drops almost instantaneously until it reaches a voltage, represented by point 56A in FIG. 3B, that is slightly below the voltage at the output of amplifier A when switch S–1 opened, represented by point 54A in FIG. 3B and stored by capacitor 51. The emitter-to-base circuit of transistor 36 thereby becomes forward-biased to close switch S–1, loop L–1 becomes operative, and output terminal 12 is returned to a clamped condition. Thus the transient tail that follows the pulse, represented between points 56 and 58 in FIG. 3A, is eliminated at output terminal 12.

Figure 3D:
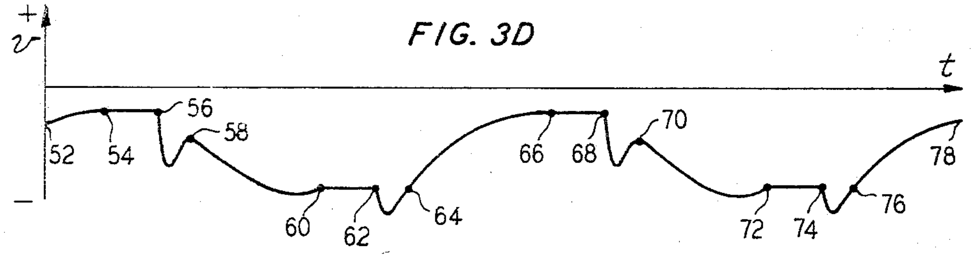

The same sequence repeats itself with each repetition of the pulse signal. As the base line of the pulse signal fluctuates, the circuit maintains a clamped condition at output terminal 12, as shown by FIG. 3C, until the threshold rate of rise occurs, indicating the start of a pulse. Each pulse, shorn of its transient tails, is reproduced at output terminal 12 accurately showing its relative height, as illustrated in FIG. 3C. The voltage appearing across capacitor 51 reproduces the base line of the input pulse signal and remains essentially constant during the period that loop L–2 is operative, as illustrated in FIG. 3D. This can be confirmed by considering that according to well-known operational amplifier principles, the net voltage at the input of amplifier A is essentially zero, i.e., it is a virtual ground. Thus the sum of the wave form in FIG. 3C and the wave form in FIG. 3D equals the wave form of FIG. 3A multiplied times a constant scaling factor.

As previously mentioned, practice of the invention requires that the rate of rise of the pulses exceed the rate of rise of the pulse tails, e.g., the rate of rise between points 54 and 55 in FIG. 3A must be greater than the rate of rise between points 57 and 58. This is a condition that is met in most practical communication channels. Generally to satisfy this condition, $$e_{max}/e_{min}<\tau/t_r$$

where $e_{max}$ is the maximum voltage of the input pulse signal, $e_{min}$ is the minimum voltage of the input pulse signal, $\tau$ is the reciprocal of the cut-off frequency of the high-pass transmission channel through which the pulse signal passes, and $t_r$ is the rise time of the pulses.

In order to accommodate bi-polar pulses, two D.C. restorers of the type shown in FIG. 2, each designed to respond to pulses of a different polarity, are connected in parallel between terminals 10 and 12.

What is claimed is:

1. A D.C. restorer comprising an input circuit; an output circuit; a main signal path interconnecting said input circuit with said output circuit comprising a first resistor, a high gain amplifier, and a normally open voltage-actuated switch, connected in the order recited; a second resistor forming a feedback loop between said output circuit and the input of said amplifier; a normally closed switch and a third resistor connected in series forming a feedback loop between the output of said amplifier and its input, said normally closed switch opening whenever the net current therethrough becomes zero and closing whenever a predetermined bias voltage is applied thereto; means for establishing a bias current through said switch when it is closed; and a capacitor connected between ground and the junction of said third resistor and said normally closed switch; whereby said normally closed switch is opened and said normally open switch is closed when the rate of change of the signal appearing at said input circuit exceeds a threshold value while said normally closed switch is closed and said normally open switch is opened when the signal appearing at said input circuit returns to the value at which said threshold rate of change was exceeded.

2. In a D.C. restorer: an input circuit; and output circuit; a main signal path to interconnect said input circuit with said output circuit comprising a first resistor, a high gain amplifier, and a transistor switch connected in the common-collector configuration, connected in the order recited; a second resistor forming a feedback loop between said output circuit and the input of said amplifier; a normally closed switch and a third resistor connected in series forming a feedback loop between the output of said amplifier and its input, said normally closed switch comprising a p-n-p type transistor, an n-p-n type transistor, the emitters of said transistors being connected together, a diode connected between the collector of one of said transistors and the base of the other of said transistors, said diode being poled such that it is forward biased when said normally closed switch is closed, the base of said one of said transistors connected to the output of said amplifier, a first source of bias potential connected to the collector of said one of said transistors, a second source of bias potential connected to the base of said other of said transistors, a variable resistor connecting said second source to the collector of said other of said transistors, the emitters of said transistors being connected to said third resistor, said transistors being biased such that in the absence of externally applied current to the emitter-to-base circuit of said one of said transistors said transistors are saturated; and a capacitor connected between the emitters of said transistors and ground; whereby said transistor switch is cut off and said normally closed switch is closed when the rate of change of the signal appearing at said input circuit is below a threshold value, whereby said transistor switch conducts and said normally closed switch opens when the rate of change of the signal appearing at said input circuit exceeds the threshold value, and whereby said transistor switch again cuts off and said normally closed switch again closes when the signal appearing at said input circuit returns to the value at which the threshold rate of rise was exceeded.

3. In a D.C. restorer the combination of an amplifier having an input and an output, a voltage-sensitive switch for coupling the output of said amplifier to an output circuit, a feedback loop connected between the output and input of said amplifier for maintaining the amplifier output at a voltage level lower than that which is required to operate said voltage-sensitive switch, means included within said feedback loop for opening said feedback loop in response to a rate of rise of voltage at said amplifier output which exceeds a predetermined threshold thereby permitting the voltage level at said amplifier output to rise to a value which will operate said voltage-sensitive switch.

4. The combination, as defined in claim 3 wherein the means for opening said feedback loop includes a transistor having one side of its base-emitter junction connected to the output of said amplifier, a capacitor having one plate connected to the other side of said base-emitter junction and the other plate connected to reference potential, a current source for applying current to the junction of said one plate and said base-emitter junction, thereby forward biasing said base-emitter junction for all voltages at the output of said amplifier except when the rate of rise of voltage at said amplifier output exceeds said predetermined threshold.

5. Apparatus for restoring a D.C. level to voltage pulses in an input signal comprising an amplifier having an input and an output, means for coupling said input signal to the input of said amplifier, a first feedback loop connected between the output and input of said amplifier for maintaining said output within a range of voltage levels for all values of said input signal, a voltage-sensitive switch connected between the output of said amplifier and one side of an output impedance the other side of which is connected to a reference potential, said voltage sensitive switch being normally open-circuited for all values of voltage at said amplifier output within said range of voltage levels, means for open-circuiting said feedback loop in response to a rate of rise of voltage at said amplifier output which exceeds a predetermined value, and a second feedback loop connected between said output impedance and the input of said amplifier.

6. Apparatus as defined in claim 5 wherein said means for open-circuiting said first feedback loop includes a capacitor, a current source connected to one plate of said capacitor, and a transistor having a base-emitter junction, one side of which is connected to the output of said amplifier and the other side of which is connected to the junction of said current source and the one plate of said capacitor the other plate of which is connected to a second reference potential.

7. Apparatus for coupling voltage pulses in an input signal to an output circuit, said apparatus comprising a normally open voltage-sensitive switching means connected to said output circuit, means for coupling said input signal to said normally open switching means at a voltage level which will not permit activation of said normally open switching means by said input signal, and means within said coupling means responsive to a predetermined rate of change of voltage in said input signal for changing said voltage level to one which activates said normally open switching means; characterized in this that said switching means includes an emitter follower transistor amplifier, and said means for coupling the input signal includes an amplifying means having an output, a capacitor, a current source connected to one plate of said capacitor, and a transistor having a base-emitter junction one side of which is connected to the output of said amplifying means and the other side of which is connected to the junction of said current source and the one plate of said capacitor the other plate of which is connected to a reference potential.

References Cited

UNITED STATES PATENTS

| | | | |
|---|---|---|---|
| 2,673,294 | 3/1954 | Battell et al. | 328—115 XR |
| 2,429,072 | 10/1947 | Place | 328—132 XR |

ARTHUR GAUSS, *Primary Examiner.*

J. ZAZWORSKY, *Assistant Examiner.*

U.S. Cl. X.R.

328—114, 132, 172; 330—9, 11